United States Patent [19]

Munday

[11] 4,314,208
[45] Feb. 2, 1982

[54] FREQUENCY ADJUSTING METHODS AND SYSTEMS

[75] Inventor: Peter J. Munday, Woodley, England

[73] Assignee: Racal Group Services Limited, Berkshire, England

[21] Appl. No.: 39,685

[22] Filed: May 16, 1979

[30] Foreign Application Priority Data

May 26, 1978 [GB] United Kingdom ............... 23471/78

[51] Int. Cl.³ .............................................. H03L 7/00
[52] U.S. Cl. ...................................... 331/1 A; 331/25
[58] Field of Search .................... 331/1 R, 25, 20, 18, 331/10, 1 A, 17; 307/233 R; 455/260

[56] References Cited

U.S. PATENT DOCUMENTS 3,651,422  3/1972  Underhill ........................ 331/1 A
4,024,464  5/1977  Underhill et al. .................. 331/25
4,035,833  7/1977  Shepard ........................ 331/1 R

FOREIGN PATENT DOCUMENTS 839422   6/1960  United Kingdom.
1276986  6/1972  United Kingdom.
1303631  1/1973  United Kingdom.
1304852  1/1973  United Kingdom.
1314462  4/1973  United Kingdom.

OTHER PUBLICATIONS

Evans, W. A. et al., "A Microprocessor Control Phase Locked Signal Source", Radio and Electronic Engineer vol. 48, No. 12, 12/78, pp. 593–602.

Primary Examiner—David K. Moore
Attorney, Agent, or Firm—Leydig, Voit, Osann, Mayer & Holt, Ltd.

[57] ABSTRACT

A frequency synthesizing arrangement is disclosed employing a phase-locked loop. The phase detector of the phase-locked loop receives an input frequency via a divider having a division factor N, and compares this divided frequency with the frequency received from a voltage controlled oscillator via a divider having a division factor N−b. Any difference is eliminated by the control signal from the phase detector which is connected to adjust the VCO frequency. Therefore, the phase-locked loop multiplies the divided input frequency by the factor (N-b). By making b very much smaller than N, the minimum step change in output frequency is approximately $F \cdot b/N^2$ (where F is the input frequency to the divider). In this way, the minimum step change in frequency can be made very small.

13 Claims, 5 Drawing Figures

FREQUENCY ADJUSTING METHODS AND SYSTEMS

BACKGROUND OF THE INVENTION

This invention relates to frequency adjusting methods and systems for adjusting the frequency of an electrical signal to approximate to a desired frequency.

Synthesis of a desired frequency can be carried out using a phase-locked loop to generate an output frequency which is a whole multiple of a base frequency fed to the phase comparator of the loop, the multiplication factor being introduced by an integer division operation applied to the output frequency feedback. A change in output frequency to approximate that frequency to a desired value is effected by changing the multiplication factor of the loop. Clearly the output frequency can only be adjusted in steps equal to the base frequency. Since it is undesirable to have a very low base frequency or a very high multiplication factor, frequency synthesis so effected either has large steps in output frequency or is restricted to low frequency bands.

An object of the invention is to provide improved frequency adjusting or synthesising methods and systems.

BRIEF SUMMARY OF THE INVENTION

According to the invention, there is provided an electrical frequency adjusting system, comprising first and second interconnected frequency changing circuits arranged to serially process an input frequency to produce an output frequency differing therefrom, one said circuit serving to effect frequency division by an integer division factor, the other said circuit serving to effect frequency multiplication by an integer multiplication factor differing from said division factor by an offset integer, and factor-adjusting means for adjusting the division and multiplication factors by the same absolute integer value to enable adjustment of the output frequency over a range of frequencies.

According to the invention, there is also provided a method of adjusting an output frequency to approximate to a desired frequency, the method comprising the steps of changing an input frequency to an intermediate frequency, changing the intermediate frequency to an output frequency approximating to the said desired frequency, one said frequency changing step being a frequency division by an integer division factor and the other frequency changing step being a frequency multiplication by an integer multiplication factor differing from the division factor by an offset integer, and adjusting the division and multiplication factors within predetermined limits to values such that the ratio of the offset integer to the division factor is the closest available approximation within those limits to the difference between the input and desired frequencies expressed as a proportion of the input frequency.

DESCRIPTION OF THE DRAWINGS

Frequency adjusting methods and systems, each according to the invention, will now be particularly described by way of example only, with reference to the accompanying diagrammatic drawings, in which.

DESCRIPTION OF PREFERRED EMBODIMENTS

Figure 1:
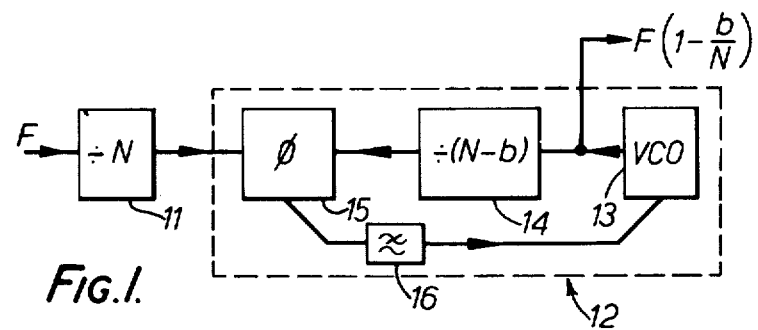
FIG. 1 is a block circuit diagram of one of the systems.
Figure 2:
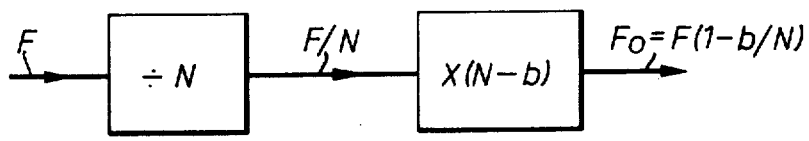
FIG. 2 is a block diagram representing the system of FIG. 1 in simplified form.

The frequency adjusting system shown in FIG. 1 comprises a frequency divider 11 which divides an input frequency F by an integer division factor N. The resulting intermediate frequency F/N is then multiplied up by an integer multiplication factor (N−b) using a frequency multiplier 12 (indicated by dashed lines in FIG. 1) formed by a phase-locked loop comprising a voltage-controlled oscillator 13, a frequency divider 14 (with a division factor of (N−b), a phase comparator 15, and a low pass filter 16. The output Fo of the multiplier 12 is the frequency F/N multiplied by (N−b), that is, Fo=F(1−b/N) which is generated at the output of the voltage-controlled oscillator 13. The frequency Fo is the system output frequency. The divider 11 and the multiplier 12 can be considered as two frequency changing circuits which serially process an input frequency F to give an output frequency Fo=F(1−b/N), and can therefore be represented as shown in FIG. 2.

Figure 3:
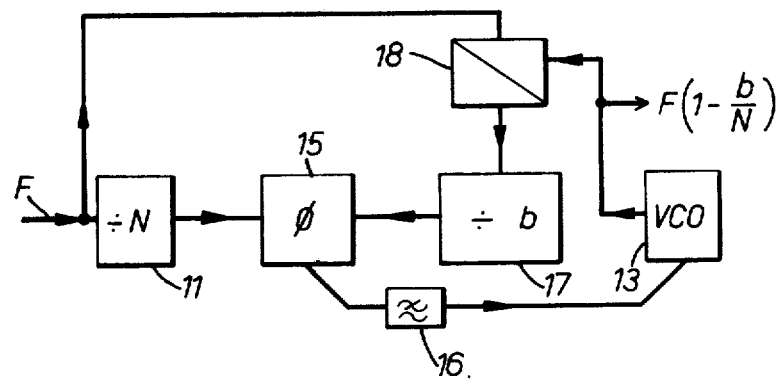
FIG. 3 is a block circuit diagram of another of the systems.

FIG. 3 shows a modified form of the system of FIG. 1 in which parts corresponding to parts in FIG. 1 are similarly referenced.

In FIG. 3, the frequency F/N is again fed into one input of the phase comparator 15. The second input of the comparator 15 receives the output frequency of a frequency divider 17 which has a division factor b, thus differing from the frequency divider 14 of FIG. 1 which has a division factor of (N−b). The input of the divider 17 is fed from the output of a mixer 18 which receives the first input from the VCO 13 and a second input carrying the input frequency F.

A filter (not shown) selects the difference frequency output (F−F$_o$) from the mixer 18 for application to the divider 17.

In the phase-locked loop of FIG. 3, therefore, $$\frac{F - F_o}{b} = \frac{F}{N}$$

thus, $\quad \dfrac{F_o}{b} = \dfrac{F}{b} - \dfrac{F}{N}$ thus, $\quad F_o = \dfrac{F - bF}{N}$ or, $\quad F_o = F(1 - b/N)$ Therefore, the arrangement of FIG. 3 operationally corresponds to the arrangement of FIG. 1 and can again be represented by the block diagram of FIG. 2.

Referring to FIG. 2, the value of the integer b, which may be termed an offset integer, can be either positive or negative, constant or variable, (in the case of the FIG. 3 arrangement b is positive when F$_o$ is greater than F so that the mixer output fed to the divider 17 is F$_o$−F).

Initially considering b to be kept constant, then as the value of the integer N is varied by the same absolute value in both the division factor of the divider 11 and the multiplication factor of the multiplier 12, the output frequency of the system varies in steps S of a magnitude which may be calculated by considering the successive values of the output frequency, (that is, for N = N' and N' + 1)

$$S = F\left(1 - \frac{b}{N'}\right) - F\left(1 - \frac{b}{N'+1}\right)$$

$$= F\left(\frac{b}{N'} - \frac{b}{N'+1}\right)$$

$$= \frac{Fb}{N'(N'+1)}$$

For $b << N$ $$S \simeq \frac{Fb}{N'^2}$$

It can be seen that the step changes in output frequency are b/N times the frequency F/N fed to multiplier 12. This is in contrast to one known form of frequency synthesiser which simply multiplies up a base frequency F by an integer factor giving output frequency steps of F. Thus for the same output frequency step size, the frequency fed to the multiplier is N/b larger in the FIG. 2 system which is of advantage. Considering a specific example, for an output frequency of around 1 MHz alterable in 1 Hz step sizes, the previous synthesiser would require a base frequency of 1 Hz and a value of N of $10^6$. The FIG. 2 system can use a multiplier input frequency of 1 kHz and values of N of $10^3$ with b equal to unity.

For a given value of b, the FIG. 2 system has a stepped output frequency range the span of which is determined by the maximum and minimum values of N. Since the frequency step size S is approximately $Fb/N^2$, the size of step will decrease (and the output frequency increase) as N is increased.

By changing the value of b to a different integer, another stepped frequency range can be obtained by varying the value of N. Making b settable to a number of different values enables a corresponding number of stepped frequency ranges to be obtained. These ranges may overlap with each other depending on the range of values of N available.

Not only will the frequency step size S vary within each stepped frequency range as N changes, but the higher frequency ranges (that is, with lower values of b) will generally have smaller step sizes.

The maximum and minimum values of N and b to give a desired overall output frequency span $\Delta F$ without interruptions between successive stepped frequency ranges can be readily derived as set out below.

(1) The overall output frequency span $\Delta F$ is given by $$\Delta F = \left(\frac{b_{max}}{N_{min}} - \frac{b_{min}}{N_{max}}\right) \cdot F$$

(2) For the lowermost output frequency, use $N = N_{min}$, $b = b$ max. As the output frequency is required to increase, increase N keeping b constant until a value of N is reached satisfying $$\frac{b_{max}}{N} = \frac{b_{max} - 1}{N_{min}} \text{ i.e. } N = \left(\frac{b_{max}}{b_{max} - 1}\right) \cdot N_{min}$$

At this point, change b to $b_{max} - 1$ and start again from $N = N_{min}$. When a value of N is then reached satisfying $$\frac{b_{max} - 1}{N} = \frac{b_{max} - 2}{N_{min}} \text{ i.e. } N = \left(\frac{b_{max} - 1}{b_{max} - 2}\right) \cdot N_{min}$$

change b to $b_{max} - 2$ and put N back to $N_{min}$. Continue in this way until the full range of output frequencies has been generated. The value of $N_{max}$ is then given by $$\frac{b_{min} + 1}{b_{min}} \cdot N_{min}$$

To provide an output frequency approximating to any particular desired frequency in the overall output frequency span of the system, the appropriate value of b and N are calculated to select the stepped frequency range required and the nearest spot frequency in that range to the desired frequency. The division factors of the dividers 11 and 14 are then set to N and (N−b) respectively. The selection of the values of the factors N and (N−b) may be performed in any suitable manner, for example using a microprocessor or a look-up table held in memory and arranged to output factor values appropriate for the desired frequency.

The error between the desired and actual output frequency of the synthesiser is at most equal to half the frequency step size S, thus:

$$\epsilon \leq \tfrac{1}{2} S$$

The maximum error will occur when S is greatest, that is, when b is a maximum and N a minimum:

$$\epsilon_{max} = \frac{b_{max}}{2(N_{min})^2}$$

From an alternative viewpoint, selection of the required value of b and N to give an output frequency approximating to a desired frequency may be considered as a selection of the multiplication and division factors (within the possible ranges of these factors as set by the system design) such that the ratio of the offset b to the division factor N is the closest available approximation to the difference between the input and desired frequencies expressed as a proportion of the input frequency. Thus if $F_d$ is the desired frequency $$\frac{b}{N} = \frac{1}{F} (F - F_d)$$

(The above equation may be derived by setting the output frequency formula given in FIG. 1 to approximately equal $F_d$).

In cases where the range of output frequencies is sufficiently small, the voltage controlled oscillator in the multiplying circuit could advantageously be crystal controlled, thereby giving a spectrally very pure output frequency.

Two or more frequency adjusting systems of the FIG. 2 form can be cascaded to give a wider overall frequency span (FIG. 4 system) or finer frequency steps.

Figure 4:
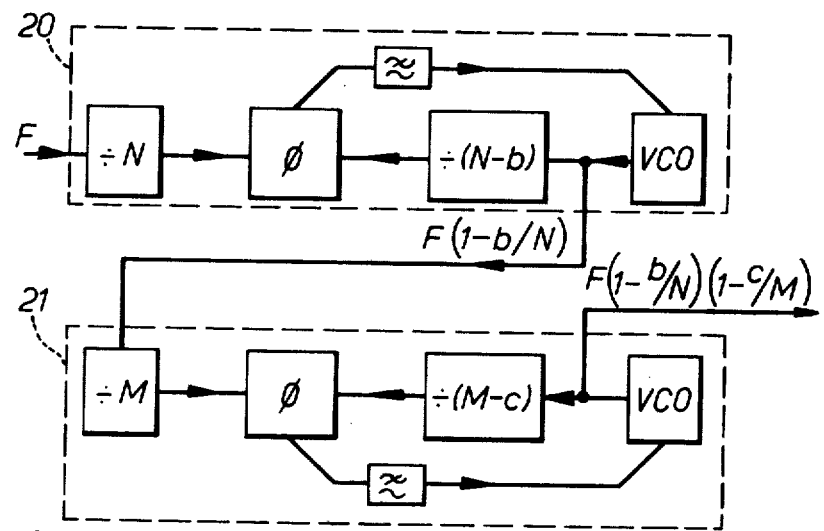
FIG. 4 is a block circuit diagram of a frequency adjusting system comprising two cascaded systems of the FIG. 1 form.

In the FIG. 4 system, two frequency adjusting systems 20 and 21 (indicated by dashed lines) are used, each having the form shown in FIG. 1 (but alternatively each could have the form shown in FIG. 3). The systems 20 and 21 respectively act as fine and coarse frequency adjusting means. The system 20 has integer division and multiplication factors of N and (N−b) respectively and generates an output frequency F (1−b/N) from an input frequency of F. The system 21 has integer division and multiplication factors M and (M−c) and processes the output frequency of the system 20 to produce a final output frequency of F (1−b/N) (1−c/M).

The second, "coarse", frequency adjusting system is arranged to have a large step change in output frequency and a wide overall span of output frequencies. The first, "fine", frequency adjusting system 20 is used to provide intermediate frequency steps. Thus, for example, the "coarse" system could have c=1, M=50 to 100 giving a possible 1% change in output frequency with a maximum step size of approximately $4.10^{-2}\%$. If the "fine" system 20 has b=1, N=1000 to 2000, its range of output frequency adjustment is $5\times10^{-2}\%$, which is sufficient to cover the largest step change due to the "coarse" system. The largest step change due to the "fine" system 20 is 1 part in $10^6$. Thus the overall system of FIG. 4 produces step changes of 1 ppm over a range of 1% of output frequency.

To give very fine step changes in frequency the FIG. 4 system can be modified by setting M equal to N and c equal to (−b). The overall system output frequency is thus:

$$F\left(1 - \frac{b}{N}\right)\left(1 + \frac{b}{N}\right)$$

$$= F\left(1 - \frac{b^2}{N^2}\right)$$

The step change in output frequency for a change in the value of N for both circuits 20 and 21 is:

$2b/N^3$

For example, for $N=10^3$, b=1, a fractional change in output frequency of the order of 2 parts in $10^9$ is possible.

The frequency adjusting system of FIG. 2 can be used to compensate for an error in a frequency standard due, for example, to temperature provided the a parameter such as temperature dependency of the error from a nominal frequency is known. Thus if a frequency standard unit which comprises a frequency source is arranged to generate a source frequency F (1+x) where x is the undesired parameter error to be compensated for, than after processing by the FIG. 2 system an output frequency is produced of F (1+x) (1−b/N). This output frequency can be kept constant by choosing N and b to give:

$(1 + x)(1 - b/N) =$ constant $K$ $$\frac{b}{N} = \frac{(1-K)+x}{1+x}$$

It will be seen from this equation for b/N and from FIG. 2, that minimizing the error x in the output frequency may be achieved in such a system by including means connecting the adjusting means for the factors b and N to be responsive to the parameter, such that the division and multiplication factors are adjusted by the same absolute integer value and in dependence on the parameter.

Figure 5:
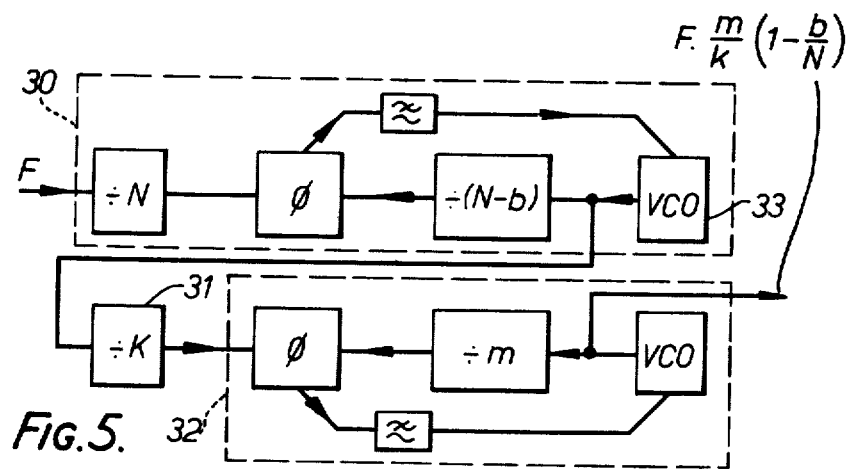
FIG. 5 is a block circuit diagram of a frequency synthesiser.

The described frequency adjusting systems can be advantageously used in frequency synthesisers having a wide range of output frequencies, as shown in FIG. 5. In the synthesiser shown in this Figure, a frequency adjusting system 30 precedes a divider 31 dividing by a factor K and multiplier circuit 32 multiplying by a factor m, either of which can be variable. Varying the value of the factor m causes large steps in output frequency while the frequency adjusting system 30 can be used to give intermediate steps. Since the output of the frequency adjusting system 30 has only small changes in output frequency, the voltage controlled oscillator 33 of the system 30 could advantageously be crystal controlled, giving a spectrally very pure reference frequency to the multiplier circuit 32. For example, if the output frequency required is 30 to 60 MHz in 10 Hz steps accurate to 2 Hz, the input frequency to the multiplier circuit 32 could be made approximately 10 kHz. The multiplication factor m would then in the range 3000 to 6000. The frequency adjusting system 30 would be required to have a range of 333 ppm, and suitable ranges of N and b would be 10000 to 15000 and 5 to 2 respectively. These values would give a maximum output step size of 0.05 ppm or 3 Hz at 60 MHz; the maximum frequency error would then be 1.5 Hz.

An advantage of varying K and keeping m constant, instead, is that the loop 32 then has a constant gain.

In FIG. 5, the frequency adjusting system 30 is shown as being a system of the form shown in FIG. 1. Instead, of course, it could be a system of the form shown in FIG. 3.

In the systems described above the reference to FIGS. 1, 2 and 3, the step of frequency division has been illustrated as being carried out before the step of frequency multiplication. However, it will be appreciated that the order of these steps can be reversed so as to carry out frequency multiplication before frequency division.

The system shown in FIG. 3 may be advantageous as compared with the system of FIG. 1 in certain circumstances because the system of FIG. 3 involves only a single variable divider (divider 11) which illustrates one means for simultaneously adjusting the frequency division and multiplication factors.

What is claimed is:

1. A method of adjusting an output frequency to approximate to a desired frequency, the method comprising the steps of generating an input frequency, carrying out a first frequency changing step to change the said input frequency to an intermediate frequency, simultaneously carrying out a second frequency changing step to change the intermediate frequency to an output frequency, one said frequency changing step being a frequency division by an integer division factor and the other frequency changing step being a frequency multiplication by an integer multiplication factor differing from the division factor by an offset integer, and simultaneously adjusting the division and multiplication factors within predetermined limits to values such that the ratio of the offset integer to the division factor is the closest available approximation within those limits to the difference between the input and desired frequencies expressed as a proportion of the input frequency, whereby the output frequency approximates to the desired frequency.

2. A method according to claim 1, in which the first-mentioned and second-mentioned frequency changing steps respectively effect said frequency division and frequency multiplication.

3. A method according to claim 2, in which the offset integer is kept constant.

4. An electrical frequency adjusting system, comprising
a source of input frequency,
first and second frequency changers connected in series,
means feeding the input frequency to the first frequency changer so that the second frequency changer produces an output frequency differing from the input frequency,
one of the said first and second frequency changers serving to effect frequency division by an integer division factor and the other of the said first and second frequency changers serving to effect frequency multiplication by a multiplication factor differing from the division factor by an offset integer,
means for adjusting the division and multiplication factors within predetermined limits, and
factor-adjusting means connected to set the division and multiplication factors to values such that the ratio of the offset integer to the division factor is the closest available approximation within said limits to the difference between the input and desired frequencies expressed as a proportion of the input frequency.

5. A system according to claim 4, in which the first frequency changer is connected to effect the frequency division and the second frequency changer is arranged to effect the frequency multiplication.

6. A system according to claim 4, in which the frequency changer effecting multiplication is a phase-locked loop.

7. An electrical frequency adjusting system, comprising
a frequency standard unit which comprises a frequency source arranged to generate a source frequency having a parameter-dependent frequency error from a nominal frequency,
first and second interconnected frequency changing circuits connected to receive and serially process the said source frequency to produce an output frequency differing therefrom,
one said circuit serving to effect frequency division by an integer division factor,
the other said circuit serving to effect frequency multiplication by an integer multiplication factor differing from said division factor by an offset integer, and means responsive to the said parameter and connected to the two said circuits to adjust the division and multiplication factors by the same absolute integer value and in dependence on the said parameter thereby to adjust the output frequency to minimise the frequency error between the source frequency and the nominal frequency.

8. A system according to claim 7, in which the first frequency changing circuit is the circuit effecting frequency division by the division factor.

9. A system according to claim 8, in which the second frequency changing circuit is a phase-locked loop connected to the first frequency changing circuit to effect multiplication of the output of the first frequency changing circuit by the said multiplication factor.

10. A system according to claim 9, in which the phase-locked loop comprises
an adjustable oscillator for producing the said output frequency,
a phase comparator having two inputs and an output,
a frequency divider having a division factor equal to the said integer multiplication factor,
means connecting the divider to divide the output frequency of the oscillator and to feed it to one input of the phase comparator, and
means connecting the other input of the phase comparator to receive the output of the first frequency changing circuit,
the phase comparator being operative to determine the phase difference between the signals received at its two inputs and being connected to adjust the frequency of the adjustable oscillator in response to any said difference and in a direction and by an amount to reduce the difference to zero.

11. A system according to claim 7, in which the second frequency changing circuit comprises a phase-locked loop including adjustable oscillator means producing the said output frequency, the loop comprising means connected to compare and determine the difference between the output of the first frequency changing circuit and the quotient obtained by dividing the difference between the input frequency and the output frequency by the said offset integer and means to adjust the oscillator means in a direction and by an amount to reduce the difference to zero, whereby to effect multiplication of the output of the first frequency changing circuit by the said multiplication factor.

12. A system according to claim 11, in which the phase-locked loop comprises
a frequency subtracting circuit connected to subtract the output frequency from the input frequency to produce a difference frequency,
a phase comparator having two inputs and an output,
a frequency divider having a division factor equal to the said offset integer,
means connecting the divider to receive the difference frequency and to feed it to one input of the phase comparator,
means connecting the other input of the phase comparator to receive the output of the first frequency changing circuit,
the phase comparator being operative in response to any phase difference between the signals at its two inputs to adjust the output frequency of the oscillating means in a direction and by an amount to reduce the said difference to zero.

13. A circuit according to claim 7, in which said parameter is temperature.

* * * * *